United States Patent
Epperson et al.

(10) Patent No.: US 7,109,791 B1
(45) Date of Patent: Sep. 19, 2006

(54) TAILORED COLLECTOR VOLTAGE TO MINIMIZE VARIATION IN AM TO PM DISTORTION IN A POWER AMPLIFIER

(75) Inventors: Darrell G. Epperson, Oak Ridge, NC (US); Ryan Bosley, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 109 days.

(21) Appl. No.: 10/887,744

(22) Filed: Jul. 9, 2004

(51) Int. Cl.
H03G 5/16 (2006.01)
H03G 9/00 (2006.01)

(52) U.S. Cl. .................. 330/133; 330/134; 330/296; 330/310; 330/261; 330/200; 327/560; 327/309

(58) Field of Classification Search ............ 330/133, 330/134, 296, 310, 261, 200; 327/560, 309
See application file for complete search history.

(56) References Cited

U.S. PATENT DOCUMENTS

| | | | |
|---|---|---|---|
| 4,446,440 A | 5/1984 | Bell | 330/10 |
| 4,701,957 A | 10/1987 | Smith | 381/61 |
| 4,739,759 A | 4/1988 | Rexroth et al. | 128/303.14 |
| 5,204,637 A | 4/1993 | Trinh | 330/129 |
| 5,251,330 A | 10/1993 | Chiba et al. | 455/91 |
| 5,276,917 A | 1/1994 | Vanhanen et al. | 455/89 |
| 5,438,683 A | 8/1995 | Durtler et al. | 455/74 |
| 5,442,322 A | 8/1995 | Kornfeld et al. | 330/285 |
| 5,493,255 A | 2/1996 | Murtojarvi | 330/296 |
| 5,511,234 A | 4/1996 | Ha | 455/127 |
| 5,530,404 A | 6/1996 | Debroux | 330/278 |
| 5,530,923 A | 6/1996 | Heinonen et al. | 455/126 |
| 5,553,318 A | 9/1996 | Ohmagari et al. | 455/126 |
| 5,559,471 A | 9/1996 | Black | 330/277 |
| 5,561,395 A | 10/1996 | Melton et al. | 330/2 |
| 5,574,991 A | 11/1996 | Miyama et al. | 455/126 |
| 5,606,284 A | 2/1997 | Tamesue et al. | 330/129 |
| 5,608,353 A | 3/1997 | Pratt | 330/295 |
| 5,621,354 A | 4/1997 | Mitzlaff | 330/52 |
| 5,629,648 A | 5/1997 | Pratt | 330/289 |

(Continued)

FOREIGN PATENT DOCUMENTS

JP 61095603 5/1986

(Continued)

OTHER PUBLICATIONS

P. Asbeck, G. Hanington, P.F. Chen, and L.Larson, "Efficiency and Linearity Improvement in Power Amlifiers for Wireless Communications," Univeristy of California, San Diego, La Jolla, CA, IEEE 1998, pp. 15-18.

Primary Examiner—Michael B Shingleton
(74) Attorney, Agent, or Firm—Withrow & Terranova, PLLC

(57) ABSTRACT

A system is provided for substantially reducing variation in AM to PM distortion of a power amplifier caused by variations in RF drive power and temperature. The system includes power control circuitry and power amplifier circuitry. The power amplifier circuitry includes an input amplifier stage and at least one additional amplifier stage coupled in series with the input amplifier stage. The power control circuitry provides a first supply voltage to the input amplifier stage based on a control signal such that the first supply voltage has a predetermined DC offset with respect to the control signal. The first supply voltage is provided such that the predetermined DC offset substantially reduces variations in the AM to PM distortion of the power amplifier due to variations in radio frequency (RF) drive power.

35 Claims, 4 Drawing Sheets

U.S. PATENT DOCUMENTS

| | | | |
|---|---|---|---|
| 5,715,527 A | 2/1998 | Horii et al. | 455/126 |
| 5,808,453 A | 9/1998 | Lee et al. | 323/224 |
| 5,828,692 A | 10/1998 | Walley | 375/130 |
| 5,831,477 A | 11/1998 | Tsumura | 330/51 |
| 5,834,975 A | 11/1998 | Bartlett et al. | 330/278 |
| 5,847,602 A | 12/1998 | Su | 330/10 |
| 5,861,776 A | 1/1999 | Swanson | 330/124 R |
| 5,862,461 A | 1/1999 | Yoshizawa et al. | 455/127 |
| 5,870,296 A | 2/1999 | Schaffer | 363/65 |
| 5,872,481 A | 2/1999 | Sevic et al. | 330/51 |
| 5,942,946 A | 8/1999 | Su et al. | 330/310 |
| 5,973,556 A | 10/1999 | Su | 330/10 |
| 5,994,963 A | 11/1999 | Kawai et al. | 330/277 |
| 6,002,923 A | 12/1999 | Sahlman | 455/118 |
| 6,025,753 A | 2/2000 | Landherr et al. | 330/285 |
| 6,043,707 A | 3/2000 | Budnik | 330/10 |
| 6,049,704 A | 4/2000 | Peckham et al. | 455/232.1 |
| 6,069,530 A | 5/2000 | Clark | 330/149 |
| 6,101,224 A * | 8/2000 | Lindoff et al. | 375/300 |
| 6,137,274 A | 10/2000 | Rajagopalan | 323/272 |
| 6,148,220 A | 11/2000 | Sharp et al. | 455/572 |
| 6,160,855 A | 12/2000 | Nakamura et al. | 375/280 |
| 6,188,877 B1 | 2/2001 | Boesch et al. | 455/74 |
| RE37,407 E | 10/2001 | Eisenberg et al. | 330/2 |
| 6,313,705 B1 | 11/2001 | Dening et al. | 330/276 |
| 6,327,462 B1 | 12/2001 | Loke et al. | 455/127 |
| 6,356,745 B1 | 3/2002 | Lee et al. | 455/232.1 |
| 6,366,177 B1 | 4/2002 | McCune et al. | 332/103 |
| 6,369,649 B1 | 4/2002 | Nakajima | 330/51 |
| 6,374,127 B1 | 4/2002 | Park | 455/572 |
| 6,377,784 B1 | 4/2002 | McCune | 455/108 |
| 6,397,090 B1 | 5/2002 | Cho | 455/574 |
| 6,405,054 B1 | 6/2002 | Rozenblit et al. | 455/522 |
| 6,414,469 B1 | 7/2002 | Zhou et al. | 323/272 |
| 6,441,694 B1 | 8/2002 | Turcotte et al. | 332/100 |
| 6,445,249 B1 | 9/2002 | Khan et al. | 330/149 |
| RE38,140 E | 6/2003 | Schaffer | 363/65 |
| 6,701,138 B1 | 3/2004 | Epperson et al. | 455/127 |
| 6,734,724 B1 * | 5/2004 | Schell et al. | 330/10 |
| 2001/0006355 A1 | 7/2001 | Park | 330/285 |
| 2002/0002038 A1 | 1/2002 | Seawright et al. | 455/127 |
| 2002/0077066 A1 | 6/2002 | Pehlke et al. | 455/73 |
| 2002/0127980 A1 | 9/2002 | Amanullah et al. | 455/127 |
| 2003/0054778 A1 | 3/2003 | Hecht | 455/115 |
| 2003/0083026 A1 | 5/2003 | Liu | 455/127 |
| 2003/0090325 A1 | 5/2003 | Canyon et al. | 330/285 |
| 2004/0183511 A1 | 9/2004 | Dening | 323/282 |

FOREIGN PATENT DOCUMENTS

| | | |
|---|---|---|
| JP | 5235657 | 9/1993 |

* cited by examiner

TAILORED COLLECTOR VOLTAGE TO MINIMIZE VARIATION IN AM TO PM DISTORTION IN A POWER AMPLIFIER

FIELD OF THE INVENTION

The present invention relates to power amplifiers and more particularly relates to controlling a power amplifier to reduce variation in AM to PM distortion.

BACKGROUND OF THE INVENTION

Transmitters form a significant portion of most communication circuits. As such, they assume a position of prominence in design concerns. With the proliferation of mobile terminals, transmitter design has progressed in leaps and bounds as designers try to minimize components and reduce size, power consumption, and the like. Likewise, modulation schemes are continuously updated to reflect new approaches to maximize information transfers within limited bandwidth constraints.

One relatively recent change has been the advent of the Enhanced Data for GSM Evolution (EDGE) scheme in GSM systems. This system contains amplitude modulation components, and, as a result, the power amplifier must be linear and should not operate in saturation when classical modulation techniques are employed. Such a linear system lacks the efficiency of one that operates the power amplifier in saturation.

If a polar modulation system is used instead of a classical modulation system, then the power amplifier may operate in saturation and efficiency is greatly improved. In a polar modulation system, the amplitude component of a polar signal controls the power amplifier and will cause unwanted phase components to be created in the output of the power amplifier due to the non-linearities of the power amplifier. This is sometimes called amplitude modulation to phase modulation (AM to PM) distortion, and it degrades the spectral purity of the system and the Error Vector Magnitude. Further, the AM to PM distortion of the power amplifier may vary depending on factors such as the radio frequency (RF) power at the input of the amplifier and temperature. Thus, there remains a need for a system that compensates for variations in the AM to PM distortion of the power amplifier.

SUMMARY OF THE INVENTION

The present invention provides a system for substantially reducing variation in AM to PM distortion of a power amplifier caused by variations in RF drive power and temperature. In general, the system includes power control circuitry and power amplifier circuitry. The power amplifier circuitry includes an input amplifier stage and at least one additional amplifier stage coupled in series with the input amplifier stage. The power control circuitry provides a first supply voltage to the input amplifier stage based on a control signal such that the first supply voltage has a predetermined DC offset with respect to the control signal. The predetermined DC offset is provided such that the first supply voltage having the predetermined offset substantially reduces variations in the AM to PM distortion of the power amplifier due to variations in radio frequency (RF) drive power at the input of the power amplifier circuitry. The predetermined DC offset may also be provided in order to substantially reduce variations in the AM to PM distortion due to variations in temperature in addition to variations in the AM to PM distortion due to variations in RF drive power.

In addition to applying a DC offset to the first supply voltage, the power control circuitry may further operate to provide the first supply voltage such that it has a predetermined gain with respect to the control signal. The predetermined gain may be provided such that the first supply voltage is a maximum value when the control signal is at its maximum value.

In addition to applying the predetermined DC offset and gain to the first supply voltage, the power control circuitry may also provide the first supply voltage based on a predetermined sequencing. More specifically, the power control circuitry may provide the first supply voltage such that the first supply voltage is essentially equal to the predetermined DC offset when the control signal is less than a predetermined threshold and is a linear function of the control signal when the control signal is greater than the predetermined threshold.

In one embodiment, the at least one additional amplifier stage includes a second amplifier stage coupled in series with the input amplifier stage and an output amplifier stage coupled in series with the second amplifier stage. The power control circuitry provides the first supply voltage to the input amplifier stage and a second supply voltage to the second amplifier stage. Similarly to the first supply voltage, the power control circuitry may provide the second supply voltage based on the control signal such that the second supply voltage has a predetermined DC offset and gain with respect to the control signal. The predetermined DC offset and gain of each of the first and second supply voltages are selected such that the combined effect of the first and second supply voltages is to substantially reduce variations in the AM to PM distortion of the power amplifier due to variations in RF drive power. The DC offsets and gains of the first and second supply voltages may also be selected such that the combined effect of the first and second supply voltages is to substantially reduce variations in the AM to PM distortion of the power amplifier due to variations in temperature rather than or in addition to substantially reducing the variations in the AM to PM distortion of the power amplifier due to variations in RF drive power.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 2:
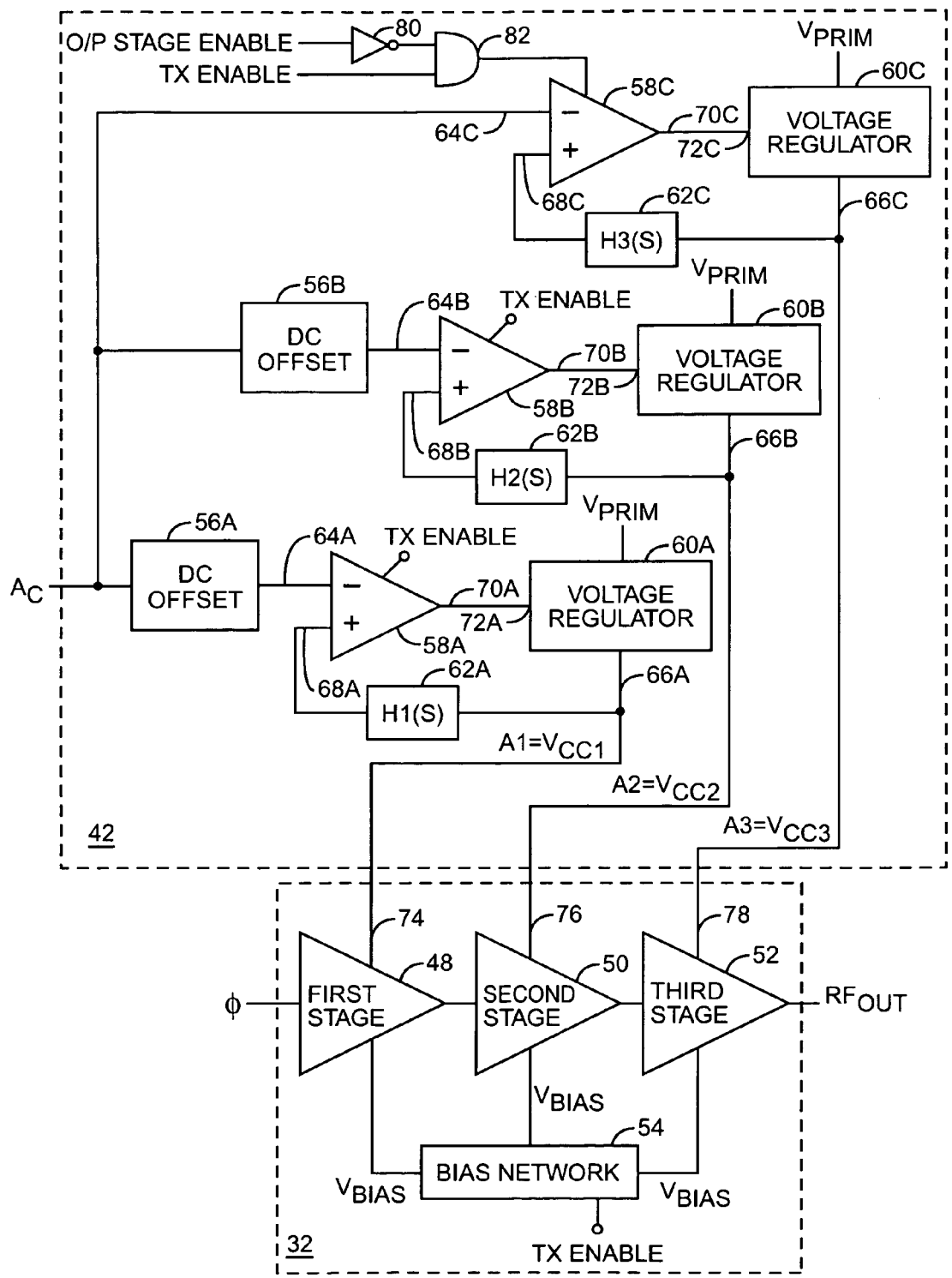
FIG. 2 is a schematic drawing of a power amplifier chain and control logic used in a user element according to one embodiment of the present invention.
Figure 3A:
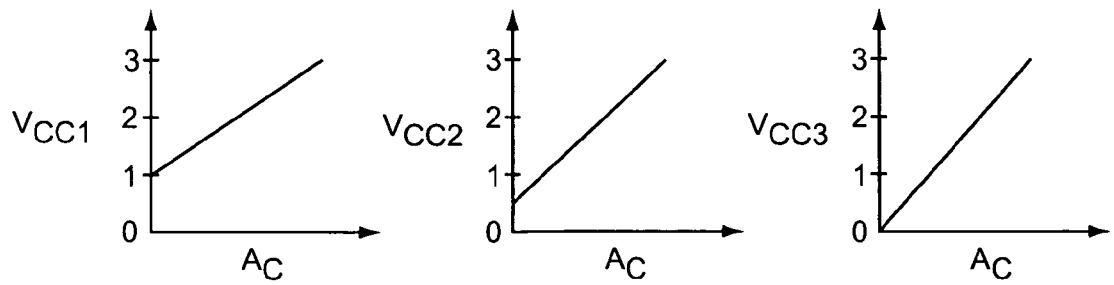
FIG. 3A is a graphical representation of the supply voltages provided to the stages of the power amplifier chain illustrated in FIG. 2 according to one embodiment of the present invention.
Figure 3B:
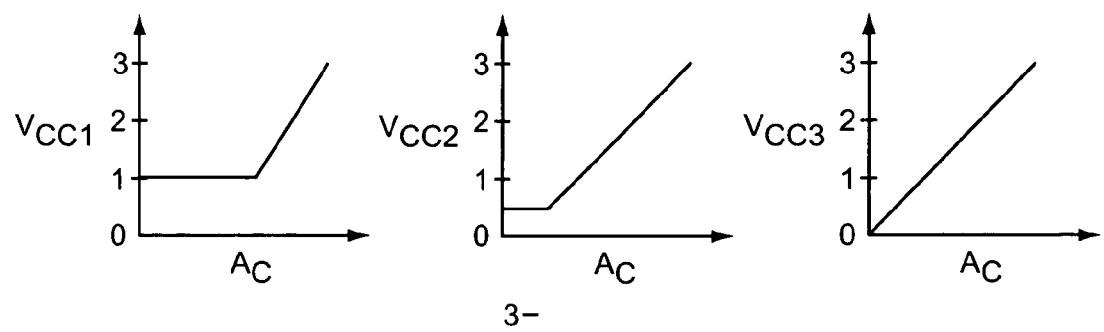
Figure 4:
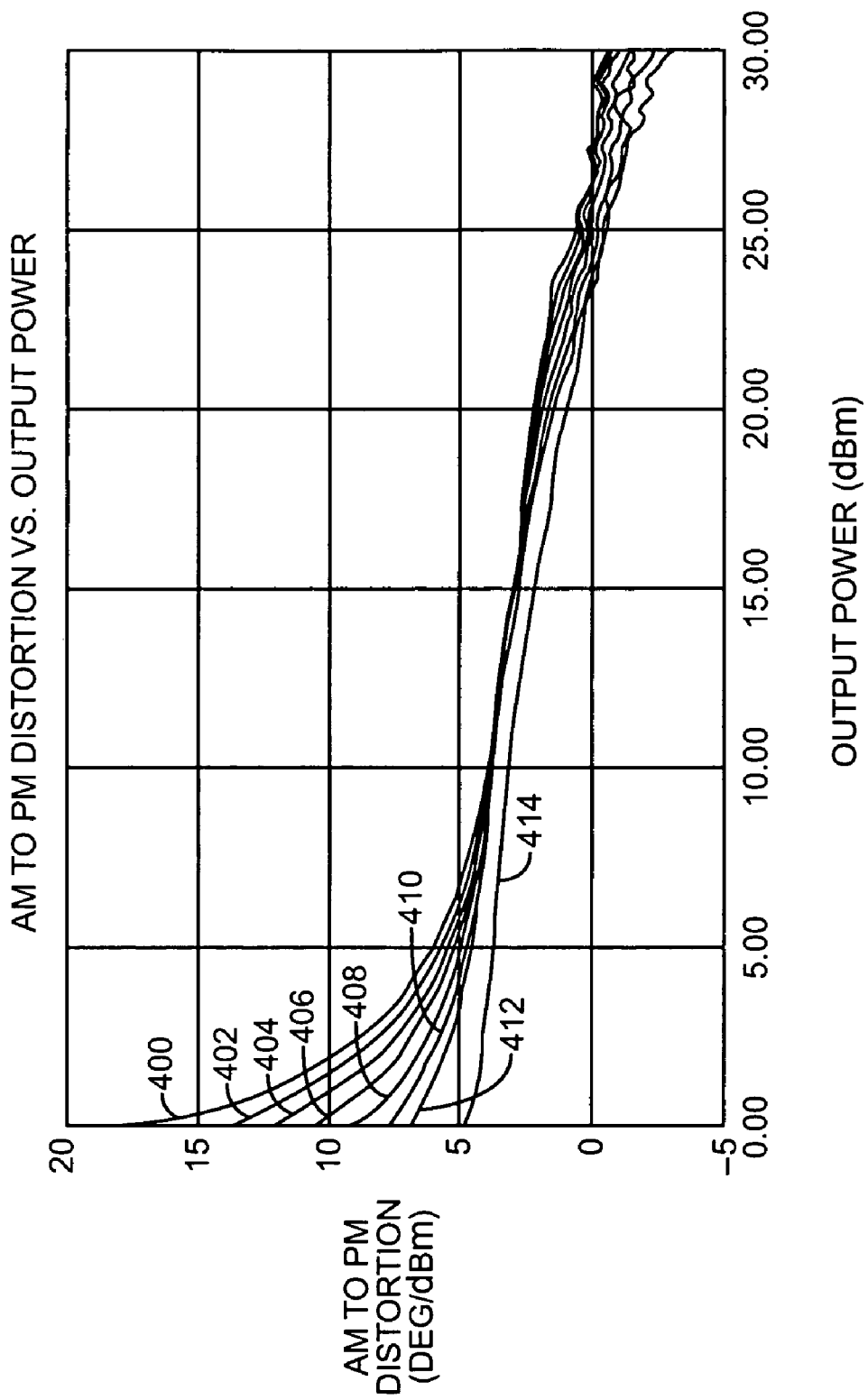

FIG. 3B is a graphical representation of the supply voltages provided to the stages of the power amplifier chain illustrated in FIG. 2 according to another embodiment of the present invention; and FIG. 4 is a graphical representation illustrating the benefit of tailoring one or more supply voltages provided to the power amplifier chain to reduce variations in the amplitude to phase (AM to PM) distortion of the power amplifier chain according to the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
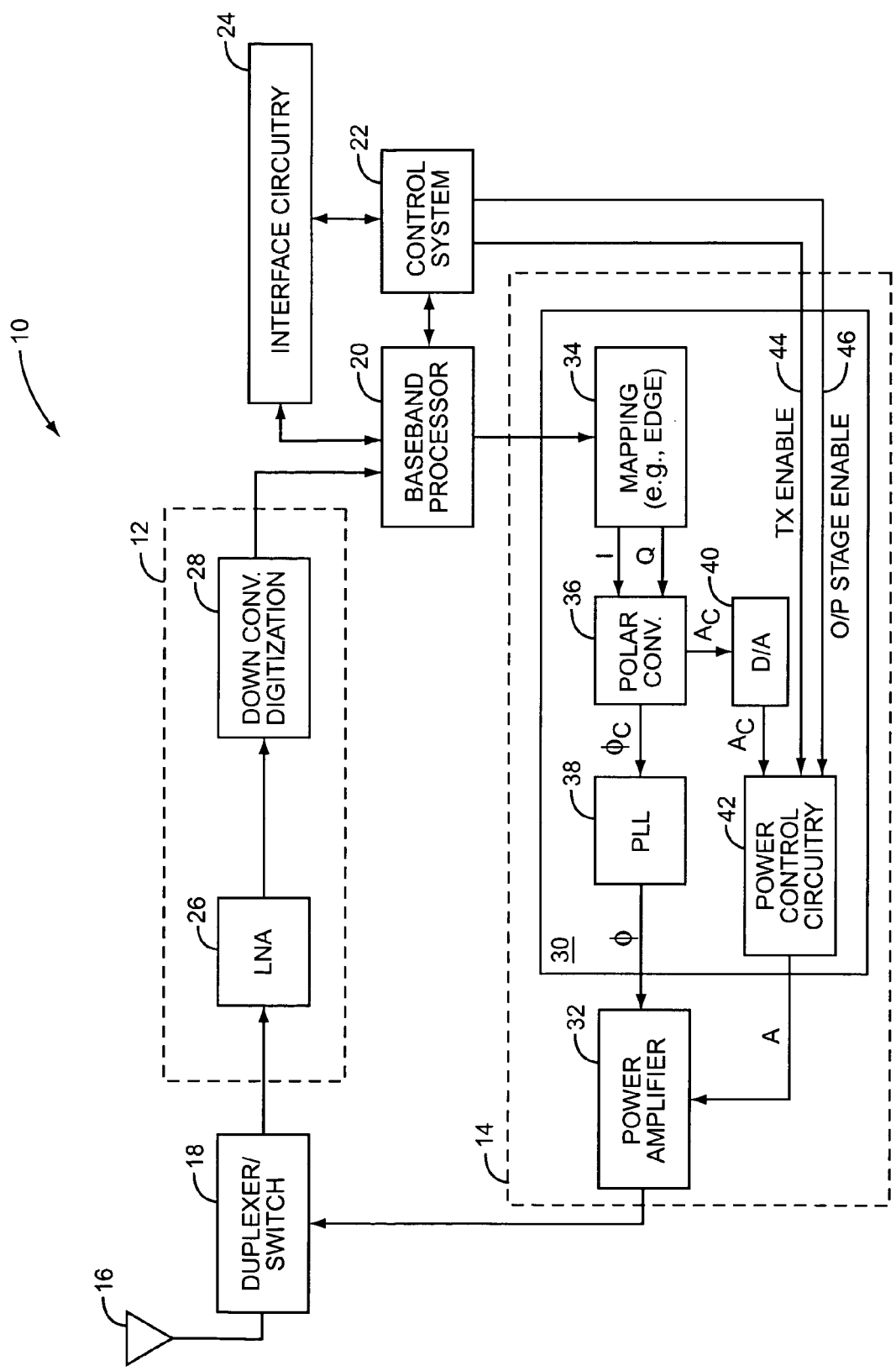
FIG. 1 is a schematic drawing of a user element constructed according to the present invention.

The present invention is preferably incorporated in a user element 10, such as a mobile telephone, personal digital assistant, wireless modem, wireless network interface, or the like, which implements polar modulation. The basic architecture of the user element 10 is represented in FIG. 1 and may include a receiver front end 12, a radio frequency transmitter section 14, an antenna 16, a duplexer or switch 18, a baseband processor 20, a control system 22, and interface circuitry 24. The receiver front end 12 receives information bearing radio frequency signals from one or more remote transmitters provided by a base station (not shown). A low noise amplifier 26 amplifies the signal. A filter circuit (not shown) minimizes broadband interference in the received signal, while a downconverter 28 downconverts the filtered, received signal to an intermediate or baseband frequency signal, which is then digitized into one or more digital streams.

The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the interface circuitry 24 directly or indirectly via the control system 22 to encode for transmission. The encoded data is output to the transmitter section 14, where it is modulated for transmission using polar modulation techniques. For polar modulation, a polar modulator 30 will process the encoded data and generate an amplitude signal (A) and a phase (or frequency) signal ($\phi$) to drive a power amplifier 32. The amplitude signal (A) controls the power supply voltage of the power amplifier 32, while the phase signal ($\phi$) represents the frequency and phase content of the modulated signal.

In one embodiment of the present invention, the polar modulator 30 may comprise several components, including, but not limited too, a mapping module 34, a polar converter 36, a phase-locked loop (PLL) 38, a digital-to-analog (D/A) converter 40, and power control circuitry 42. Although shown separately, the power amplifier 32 and the power control circuitry 42 may reside in the same module. In this embodiment, the modulation scheme for the polar modulator 30 is an Enhanced Data Rates for GSM Evolution (EDGE) modulation scheme and thus, the bit rate is 812.5 kbps. This data is passed to the mapping module 34, where every three consecutive data bits are mapped into a corresponding symbol. The resulting symbols are Grey coded and rotated by $3\pi/8$ on each symbol as per European Telecommunications Standards Institute (ETSI) specifications. For EDGE modulation, the output of the mapping module 34 provides a corresponding one of 16 rectangular coordinates, generally referred to an in-phase (I) and quadrature (Q) coordinates, for each symbol. The in-phase and quadrature coordinates (I, Q) corresponding to each symbol are filtered using finite impulse response (FIR) filters (not shown) as dictated by the ETSI specifications and then converted from rectangular to polar coordinates by the polar converter 36.

The in-phase and quadrature coordinates (I, Q) are preferably converted into phase ($\phi_c$) and amplitude ($A_c$) control signals by the polar converter 36 using a classical CORDIC (coordinate rotation digital computer). Processing by the polar converter 36 also includes a conversion from a true phase signal to a frequency signal. This conversion is well understood in the art and for the purposes of the present invention, this conversion is treated as part of the CORDIC conversion. Further information about CORDIC algorithms may be found in *Proceedings of the 1998 ACM/SIGDA Sixth International Symposium On Field Programmable Gate Arrays* by Ray Andraka, Feb. 22–24, pp. 191–200 and "The CORDIC Trigonometric Computing Technique" by Jack E. Volder, *IRE Trans on Elect. Computers*, p. 330, 1959, both of which are hereby incorporated by reference in their entireties.

At this point, the phase control signal ($\phi_C$), referred to as a frequency control signal ($\phi_C$), and amplitude control signal ($A_C$) separate and proceed by different paths, a frequency signal processing path and an amplitude signal processing path, respectively, to the power amplifier 32. With respect to the amplitude signal processing path, the digital amplitude control signal ($A_c$) is converted to an analog signal by the D/A converter 40. The output of the D/A converter 40 is an analog version of the amplitude control signal ($A_c$) and is used by the power control circuitry 42 to set the supply voltage on the power amplifier 32. Notably, the amplitude control signal ($A_c$) has a DC component reflecting the desired output power and an AC component reflecting the desired amplitude modulation characteristic. The power control circuitry 42 will process the amplitude control signal ($A_c$) and provide supply voltage for each stage of the power amplifier 32 based on the amplitude control signal ($A_C$). The supply voltages supplied to each stage of the power amplifier 32 are in essence proportionate amplitude signals (A) for driving each stage of the power amplifier 32. As the amplitude control signal ($A_C$) changes, the supply voltage at the power amplifier 32 changes and the output power will vary as $V^2/2R_{out}$, where $R_{out}$ is effectively the load on the power amplifier 32 and V is the supply voltage. Accordingly, the amplitude control signal ($A_C$) represents both a modulation and power level component at any given time. The power control circuitry 42 may also receive a transmit (TX) enable signal 44, which enables the power amplifier 32, and an output (O/P) stage enable signal 46, which selectively enables a final stage of the power amplifier 32, from the control system 22.

The frequency control signal ($\phi_C$) is used to set the frequency of the PLL 38, or like synthesizer, to generate the frequency signal ($\phi$) having the appropriate frequency and phase component to send to the power amplifier 32 for amplification. Accordingly, the power amplifier 32 will amplify the frequency signal (φ) based on the corresponding amplitude control signal ($A_C$) to provide a modulated and amplified signal for transmission via the antenna 16. Further information pertaining to polar modulation may be found in commonly assigned U.S. patent application Ser. Nos. 10/139,560 filed May 6, 2002, 10/147,569 filed May 16, 2002, and Ser. No. 10/147,579 filed May 16, 2002, which are incorporated herein by reference.

Turning now to FIG. 2, the power amplifier circuitry 32 is associated with power control circuitry 42. While a detailed discussion of amplifier chains may be found in U.S. Pat. No. 6,701,138, POWER AMPLIFIER CONTROL, issued Mar. 2, 2004; and U.S. Pat. No. 6,724,252, SWITCHED GAIN AMPLIFIER CIRCUIT, issued Apr. 20, 2004, which are assigned to RF Micro Devices, Inc. of 7628 Thorndike Road, Greensboro, N.C. 27409 and are hereby incorporated by reference in their entireties, the following outlines the basic operation of a multistage amplifier.

The power amplifier circuitry 32 may comprise any number of amplifier stages. In this embodiment, the power amplifier circuitry includes three amplifier stages, a first amplifier stage 48, a second amplifier stage 50, and a third amplifier stage 52, as well as a bias network 54 providing bias ($V_{BIAS}$) for each of the three amplifier stages 48, 50, and 52. The first and second amplifier stages 48, 50 are driver stages, while the third amplifier stage 52 is a final, output stage. In alternate embodiments, the bias network 54 may comprise multiple bias networks, one for each amplifier stage. Preferably, the bias provided to each stage 48, 50, and 52 is relatively stable regardless of power levels and the enablement of the third amplifier stage 52. Other bias arrangements are also possible, as those skilled in the art will recognize.

Certain advantages may be realized by forming two or more of the amplifier stages 48, 50, and 52 from a plurality of transistor cells arranged in parallel. For further information pertaining to the transistor arrays, reference is made to U.S. Pat. No. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entireties. Still further information may be found in commonly owned U.S. patent application Ser. No. 09/952,524, filed Sep. 14, 2001, the disclosure of which is hereby incorporated by reference. Exemplary bias networks 54 capable of being used in association with the present invention are described in further detail in U.S. Pat. No. 6,313,705, BIAS NETWORK FOR HIGH EFFICIENCY RF LINEAR AMPLIFIER, issued Nov. 6, 2001, which is also assigned to RF Micro Devices and is hereby incorporated by reference in its entirety. Upon understanding the present invention, those skilled in the art will be able to construct any number of bias networks that are compatible with the present invention.

In the illustrated embodiment, the power control circuitry 42 includes three control sections. The first control section controls a first supply voltage ($V_{CC1}$) provided to the first amplifier stage 48, the second control section controls a second supply voltage ($V_{CC2}$) provided to the second amplifier stage 50, and the third control section controls a third supply voltage ($V_{CC3}$) provided to the third amplifier stage 52. Each of the supply voltages ($V_{CC1}$, $V_{CC2}$, $V_{CC2}$) are proportionate to the amplitude control signal ($A_C$) and are in essence individual amplitude signals (A', A'', A''') that control the gain of the corresponding amplifier stages 48, 50, and 52.

The first section includes DC offset circuitry 56A, an error amplifier 58A, a voltage regulator 60A, and a feedback network 62A having a transfer function H1($s$). As noted, the power amplifier circuitry 32 provides gain for the frequency signal (φ) to be transmitted under control of the power control circuitry 42 based on the amplitude control signal ($A_C$). According to the present invention, the amplitude control signal ($A_C$) is received by the DC offset circuitry 56A. The DC offset circuitry 56A modifies the amplitude control signal ($A_C$) such that the supply voltage ($V_{CC1}$) provided to the first stage 48 has a predetermined DC offset with respect to the amplitude control signal ($A_C$). The predetermined DC offset defines the value of the supply voltage ($V_{CC1}$) when the amplitude control signal ($A_C$) is equal to a minimum value, such as zero. The transfer function H1($s$) is selected such that the supply voltage ($V_{CC1}$) has a predetermined gain, which may be defined as change in the supply voltage ($V_{CC1}$) per change in the amplitude control signal ($A_C$). The combined effect of the DC offset circuitry 56A and the transfer function H1($s$) is to adjust the DC offset and gain of the supply voltage ($V_{CC1}$) to reduce variations in the AM to PM distortion versus output power characteristic of the power amplifier circuitry 32 due to variations in RF drive power at the input of the first stage 48 and temperature. The predetermined DC offset and gain may be determined based on simulations of the power amplifier circuitry 32 or through experimental measurements of the AM to PM distortion versus output power for the power amplifier circuitry 32.

More specifically, as will be apparent to one of ordinary skill in the art, each of the stages 48, 50, and 52 include one or more transistors. If these transistors are heterojunction bipolar transistors (HBTs), sources of the AM to PM distortion of the power amplifier circuitry 42 are a base-collector capacitance and a built-in capacitance of the base-collector junction of each transistor. Both the base-collector capacitance and the built-in capacitance are functions of supply voltage provided to the collector of the transistor, RF drive power supplied at the base, and temperature. Thus, according to the present invention, the supply voltage is given a predetermined DC offset and gain with respect to the amplitude control signal ($A_C$) to essentially control the base-collector capacitance and the built-in capacitance of the base-collector junction such that variations in AM to PM distortion due to variations in RF drive power and temperature are reduced. In a similar fashion, the AM to PM distortion of other types of transistors is a function of supply voltage, RF drive power, and temperature, and the supply voltage is given a predetermined DC offset and gain with respect to the amplitude control signal ($A_C$) such that variations in the AM to PM distortion due to variations in RF drive power and temperature are substantially reduced.

After the amplitude control signal ($A_C$) is processed by the DC offset circuitry 56A, the output of the DC offset circuitry 56A is provided to an inverting input 64A of an operational amplifier forming the error amplifier 58A. It should be noted that the operational amplifier is an exemplary embodiment of the error amplifier 58A. Other embodiments will be apparent to one of ordinary skill in the art upon reading this disclosure. The regulated output 66A of the voltage regulator 60A is fed back through the feedback network 62A and received by a non-inverting input 68A of the error amplifier 58A. An output signal 70A from the error amplifier 58A is provided to a control input 72A of the voltage regulator 60A to control the regulated output 66A of the voltage regulator 60A. The regulated output 66A represents the supply voltage ($V_{CC1}$), which powers the first amplifier stage 48. It should be noted that the supply voltage ($V_{CC1}$) includes a DC component and an amplitude component corresponding to the amplitude control signal ($A_C$). The voltage regulator 60A regulates the supply voltage ($V_{CC1}$) supplied to the rail 74 of the first amplifier stage 48 to control the gain of the first amplifier stage 48 according to the amplitude control signal ($A_C$).

The second section of the power control circuitry 42 is similar to the first section and may include DC offset circuitry 56B, an error amplifier 58B, a voltage regulator 60B, and a feedback network 62B having a transfer function H2($s$). According to the present invention, the amplitude control signal ($A_C$) is received by the DC offset circuitry 56B. The DC offset circuitry 56B modifies the amplitude control signal ($A_C$) such that the supply voltage ($V_{CC2}$) provided to the second stage 50 has a predetermined DC offset with respect to the amplitude control signal ($A_C$) which may or may not be the same as the DC offset for the supply voltage ($V_{CC1}$). The transfer function H2($s$) is selected such that the supply voltage ($V_{CC2}$) has a predetermined gain, which may be defined as change in the supply voltage ($V_{CC2}$) per change in the amplitude control signal ($A_C$). The predetermined gain of the supply voltage ($V_{CC2}$) may or may not be the same as the predetermined gain of the supply voltage ($V_{CC1}$). The combined effect of the DC offset circuitry 56B and the transfer function H2($s$) is to adjust the DC offset and gain of the supply voltage ($V_{CC2}$) to further reduce variations in the AM to PM distortion of the power amplifier circuitry 32 due to variations in RF drive power at the input of the first amplifier stage 48 and temperature. The predetermined DC offset and gain for the supply voltage ($V_{CC2}$) may be determined based on simulations of the power amplifier circuitry 32 or through experimental measurements of the AM to PM distortion versus output power for the power amplifier circuitry 32.

In operation, the output of the DC offset circuitry 56B is provided to an inverting input 64B of an operational amplifier forming the error amplifier 58B. It should be noted that the operational amplifier is an exemplary embodiment of the error amplifier 58B. Other embodiments will be apparent to one of ordinary skill in the art upon reading this disclosure. The regulated output 66B of the voltage regulator 60B is fed back through the feedback network 62B and received by a non-inverting input 68B of the error amplifier 58B. An output signal 70B from error amplifier 58B is provided to a control input 72B of the voltage regulator 60B to control the regulated output 66B of the voltage regulator 60B. The regulated output 66B represents the supply voltage ($V_{CC2}$), which powers the second stage 50. It should be noted that the supply voltage ($V_{CC2}$) includes a DC component and an amplitude component corresponding to the amplitude control signal ($A_C$). The voltage regulator 60B regulates the supply voltage ($V_{CC2}$) supplied to the rail 76 of the second amplifier stage 50 to control the gain of the second amplifier stage 50 according to the amplitude control signal ($A_C$).

The third section of the power control circuitry 42 is similar to the first and second sections and may include an error amplifier 68C, a voltage regulator 70C, and a feedback network 72C having a transfer function H3($s$). However, in this embodiment, a DC offset is not applied to the supply voltage ($V_{CC3}$). In operation, the amplitude control signal ($A_C$) is also received by an inverting input 64C of an operational amplifier forming error amplifier 58C. The regulated output 66C of the voltage regulator 60C is fed back through the feedback network 62C and received by a non-inverting input 68C of the error amplifier 58C. An output signal 70C from the error amplifier 58C is provided to a control input 72C of the voltage regulator 60C to control the regulated output 66C of voltage regulator 60C. The voltage regulator 60C regulates the supply voltage ($V_{CC3}$) supplied to the rail 78 of the third amplifier stage 52 to control the gain of the third amplifier stage 52 according to the amplitude control signal ($A_C$). Accordingly, the rails 74, 76, and 78 of the first, second, and third amplifier stages 48, 50, and 52 may be controlled as a function of the amplitude control signal ($A_C$) to amplify the frequency signal ($\phi$). The rails 74, 76, and 78 will typically be coupled to the collectors of bipolar transistors or drains of field effect transistors forming the respective amplifier stages 48, 50, and 52, as will be appreciated by those skilled in the art.

Each of the voltage regulators 60A, 60B, and 60C is connected directly to a fixed or primary supply voltage, $V_{PRIM}$, which will preferably be connected to the terminal for the positive potential of a battery. As noted, the bias network 54 supplies a fixed bias to the three power amplifier stages 48, 50, and 52, regardless of the collector/drain voltage supplied to the first, second and third amplifier stages 48, 50, and 52. The fixed bias incorporates traditional $V_{APC}$ signals, which are configured to maintain a constant bias, in the preferred embodiment.

The transmit enable signal, TX ENABLE, is a logic signal used to simultaneously enable or disable the error amplifiers 58A, 58B, and 58C and the power amplifier circuitry 32 by supplying or removing the bias to or from each of the three amplifier stages 48, 50, and 52. The third amplifier stage 52 is selectively enabled or disabled by enabling or disabling the voltage regulator 60C with the output (O/P) stage enable signal. In this embodiment, the third amplifier stage 52 is either enabled or disabled based on both the transmit enable signal, TX ENABLE, and the O/P stage enable signal. More particularly, the error amplifier 58C is either enabled or disabled via the logic gates 80 and 82 based on the transmit enable signal, TX ENABLE, and the O/P stage enable signal. In operation, the frequency signal ($\phi$) to be amplified is provided at the input of the first amplifier stage 48 and amplified by either the first and second amplifier stages 48 and 50 or all three amplifier stages 48, 50, and 52 to provide an amplified output signal ($RF_{OUT}$). When enabled, the third amplifier stage 52 operates to amplify the frequency signal ($\phi$), which has been amplified by the first and second amplifier stages 48 and 50. When disabled, the third amplifier stage 52 is configured to effectively become a capacitance in series with the amplification path and output load, as described in U.S. Pat. No. 6,701,134, INCREASED DYNAMIC RANGE FOR POWER AMPLIFIERS USED WITH POLAR MODULATION, which is assigned to RF Micro Devices, Inc. of 7628 Thorndike Road, Greensboro, N.C. 27409 and is hereby incorporated by reference in its entirety.

It should be noted that the output (O/P) stage enable signal is optional. Thus, in another embodiment, the third amplifier stage 52 is either enabled or disabled based on the transmit enable signal (TX ENABLE) as described with respect to the first and second stages 48 and 50. In this embodiment, the frequency signal ($\phi$) to be amplified is provided at the input of the first amplifier stage 48 and amplified by all three amplifier stages 48, 50, and 52 to provide an amplified output signal ($RF_{OUT}$).

FIG. 3A graphically illustrates an exemplary relationship between the amplitude control signal ($A_C$) and the supply voltages ($V_{CC1}$, $V_{CC2}$, $V_{CC3}$). As illustrated, the predetermined DC offset of the supply voltage ($V_{CC1}$) is approximately 1 Volt (V). The predetermined DC offset of the supply voltage ($V_{CC2}$) is approximately 0.5 V. The supply voltage ($V_{CC3}$) does not have a DC offset. The gains of the supply voltages ($V_{CC1}$ and $V_{CC2}$) are selected such that the supply voltages ($V_{CC1}$ and $V_{CC2}$) are at a maximum value when the amplitude control signal ($A_C$) is its maximum value. Although this exemplary embodiment has modified the supply voltage ($V_{CC1}$ and $V_{CC2}$) to the first and second stage amplifiers 48 and 50, it should be noted that in another embodiment only the supply voltage ($V_{CC1}$) provided to the first amplifier stage 48 is modified.

FIG. 3B graphically illustrates an exemplary relationship between the amplitude control signal ($A_C$) and the supply voltages ($V_{CC1}$, $V_{CC2}$, $V_{CC3}$). In the embodiments described above, only the DC offset and gain of the supply voltage ($V_{CC1}$ and $V_{CC2}$) are modified. However, in another embodiment, a sequencing of the supply voltages ($V_{CC1}$ and $V_{CC2}$) may be modified in addition to or instead of the DC offset and gain. FIG. 3B illustrates an exemplary embodiment where the sequencing of the supply voltages ($V_{CC1}$ and $V_{CC2}$) is modified in addition to the DC offset and gain. As illustrated, the predetermined DC offset of the supply voltage ($V_{CC1}$) is approximately 1 Volt (V). The sequencing of the supply voltage ($V_{CC1}$) is also modified such that the supply voltage ($V_{CC1}$) is essentially constant at 1 V (the predetermined DC offset) when the amplitude control signal ($A_C$) is less than a predetermined threshold and is a linear function of the amplitude control signal ($A_C$) when the amplitude control signal ($A_C$) is greater than the predetermined threshold. Similarly, the predetermined DC offset of the supply voltage ($V_{CC2}$) is approximately 0.5 V. The sequencing of the supply voltage ($V_{CC2}$) is also modified such that the supply voltage ($V_{CC2}$) is essentially constant at 0.5 V (the predetermined DC offset) when the amplitude control signal ($A_C$) is less than a predetermined threshold and is a linear function of the amplitude control signal ($A_C$) when the amplitude control signal ($A_C$) is greater than the predetermined threshold. It should be noted that in this embodiment, the supply voltages ($V_{CC1}$ and $V_{CC2}$) do not have equivalent sequencing. In other words, in this embodiment, the predetermined threshold for the supply voltage ($V_{CC1}$) is not equivalent to the predetermined threshold value for the supply voltage ($V_{CC2}$). However, it should be noted that the predetermined threshold values for the supply voltages ($V_{CC1}$ and $V_{CC2}$) may be equivalent. The supply voltage ($V_{CC3}$) does not have a DC offset and its sequencing is not modified. The gains of the supply voltages ($V_{CC1}$ and $V_{CC2}$) are selected such that the supply voltages ($V_{CC1}$ and $V_{CC2}$) are at their maximum values when the amplitude control signal ($A_C$) is at its maximum value. Although this exemplary embodiment has modified the supply voltage ($V_{CC1}$ and $V_{CC2}$) provided to the first and second amplifier stages 48 and 50, it should be noted that in another embodiment only the supply voltage ($V_{CC1}$) provided to the first amplifier stage 48 is modified. It should also be noted that the sequencing of the supply voltages ($V_{CC1}$ and $V_{CC2}$) may be implemented in the feedback circuitries 62A and 62B.

FIG. 4 is a graphical illustration of the benefits of the present invention. More particularly, lines 400–412 illustrate the AM to PM distortion over a range of output power levels when the supply voltages are not modified according to the present invention. Each of the lines 400–412 correspond to the AM to PM distortion over the range of output power levels for a particular RF drive power. Lines 400–412 correspond to RF drive powers of 0 dBm, 1 dBm, 2 dB, 3 dBm, 4 dBm, 5 dBm, and 6 dBm, respectively. Lines 400–412 clearly show that there are variations in the AM to PM distortion due to variations in RF drive power, especially at low output power levels. Line 414 illustrates the AM to PM distortion of the power amplifier circuitry 32 when controlled by the power control circuitry 42 according to the present invention. It should be noted that line 414 illustrates that the AM to PM distortion is essentially the same for all RF drive powers, and thus the variations in the AM to PM distortion due to variations in RF drive power are substantially reduced and possibly essentially eliminated. In this exemplary embodiment, it should also be noted that the AM to PM distortion is also reduced. Since lines 400–412 show that the variations in the AM to PM distortion due to variations in RF drive power is larger at lower output power levels, an additional benefit of the present invention is to reduce the sensitivity to variations in RF drive power at low output power levels.

The present invention provides substantial opportunity for variation without departing from the spirit and scope of the present invention. For example, FIG. 2 illustrates an embodiment of the power control circuitry 42 that applies a predetermined DC offset and gain to the supply voltages ($V_{CC1}$ and $V_{CC2}$) to the first and second stage amplifiers 48 and 50. However, in another embodiment, the power control circuitry 42 may only apply a predetermined DC offset and gain to the supply voltage ($V_{CC1}$) provided to the first stage amplifier 48. In yet another embodiment, the power control circuitry 42 may modify the sequencing of the supply voltage ($V_{CC1}$) or of both of the supply voltages ($V_{CC1}$ and $V_{CC2}$) in addition to or instead of the DC offset and gain.

As another example, while three amplifier stages are preferred, other arrangements of two, four, or more are contemplated. The teachings of the present invention apply to such arrangements, and one of ordinary skill in the art can modify the present teachings to such arrangements. Further, in these arrangements, only the supply voltage to the first stage amplifier may be adjusted according to the present invention. Alternatively, when there are N amplifier stages, the supply voltages to any number of the first N−1 stages may be adjusted according to the present invention.

As yet another example, although the present invention is described in conjunction with polar modulation, the present invention may be used in any type of transmitter. Further, where amplitude modulation is not desired, the amplitude control signal ($A_C$) input into the power control circuitry 42 may be replaced with a power control signal, which may be provided by the control system 22.

Those skilled in the art will recognize improvements and modifications to the preferred embodiments of the present invention. All such improvements and modifications are considered within the scope of the concepts disclosed herein and the claims that follow.

What is claimed is:

1. A system comprising:
   a) power amplifier circuitry comprising an input amplifier stage adapted to receive a first supply voltage and at least one additional amplifier stage coupled in series with the input amplifier stage and adapted to receive at least one additional supply voltage, the power amplifier adapted to amplify a radio frequency (RF) input signal based on the first supply voltage and the at least one additional supply voltage to provide an amplified signal; and
   b) power control circuitry adapted to apply a DC offset to a control signal to create an offset control signal and provide the first supply voltage based on the offset control signal such that the first supply voltage has a predetermined DC offset with respect to the control signal and further adapted to provide the second supply voltage, wherein the predetermined DC offset of the first supply voltage reduces variations in an AM to PM distortion of the power amplifier circuitry due to variations in an RF power of the RF input signal.

2. The system of claim 1 wherein the power control circuitry is further adapted to provide the first supply voltage such that the first supply voltage has a predetermined gain with respect to the control signal.

3. The system of claim 2 wherein the predetermined gain is selected such that the first supply voltage is a maximum value when the control signal is its maximum value.

4. The system of claim 3 wherein the power control circuitry is further adapted to provide the first supply voltage such that the first supply voltage is essentially equal to the predetermined DC offset when the control signal is less than a predetermined threshold and linearly increases based on the predetermined gain when the control signal is greater than the predetermined threshold.

5. The system of claim 1 wherein the predetermined DC offset of the first supply voltage further reduces variations in the AM to PM distortion due to variations in temperature.

6. The system of claim 1 wherein the at least one additional amplifier stage comprises a second amplifier stage coupled in series with the input amplifier stage and an output amplifier stage coupled in series with the second amplifier stage, the second amplifier stage adapted to receive a second supply voltage.

7. The system of claim 6 wherein the power control circuitry is further adapted to provide the second supply voltage such that the second supply voltage has a second predetermined DC offset with respect to the control signal, wherein the predetermined DC offsets of the first and second supply voltages reduce variations in the AM to PM distortion of the power amplifier circuitry due to variations in the RF power of the RF input signal.

8. The system of claim 1 wherein the power control circuitry comprises a first section comprising:
   offset circuitry adapted to receive the control signal and apply the DC offset to provide the offset control signal, the offset selected such that the first supply voltage has the predetermined DC offset with respect to the control signal;
   an error amplifier adapted to provide a regulator control signal based on a comparison of the offset control signal and a feedback signal;
   a voltage regulator adapted to provide the first supply voltage based on the regulator control signal; and
   feedback circuitry having a transfer function and adapted to provide the feedback signal based on the first supply voltage and the transfer function.

9. The system of claim 8 wherein the transfer function is predetermined such that the first supply voltage has a predetermined gain with respect to the control signal.

10. The system of claim 9 wherein the transfer function is further predetermined such that the first supply voltage is essentially equal to the predetermined DC offset when the control signal is less than a predetermined threshold and linearly increases based on the predetermined gain when the control signal is greater than the predetermined threshold.

11. The system of claim 8 wherein the at least one additional amplifier stage comprises a second amplifier stage coupled in series with the input amplifier stage and an output amplifier stage coupled in series with the second amplifier stage, the second amplifier stage adapted to receive a second supply voltage.

12. The system of claim 11 wherein the power control circuitry further comprises a second section comprising:
   second offset circuitry adapted to receive the control signal and apply a second offset to provide a second offset control signal, the second offset selected such that the second supply voltage has a second predetermined DC offset with respect to the control signal;
   a second error amplifier adapted to provide a second regulator control signal based on a comparison of the second offset control signal and a second feedback signal;
   a second voltage regulator adapted to provide the second supply voltage based on the second regulator control signal; and
   second feedback circuitry having a second transfer function and adapted to provide the second feedback signal based on the second supply voltage and the second transfer function.

13. The system of claim 12 wherein the second transfer function is predetermined such that the second supply voltage has a predetermined gain with respect to the control signal.

14. The system of claim 13 wherein the second transfer function is further predetermined such that the second supply voltage is essentially equal to the second predetermined DC offset when the control signal is less than a predetermined threshold and linearly increases based on the predetermined gain when the control signal is greater than the predetermined threshold.

15. The system of claim 12 wherein the output amplifier stage is adapted to receive a third supply voltage and the power control circuitry further comprises a third section comprising:
   a third error amplifier adapted to provide a third regulator control signal based on a comparison of the control signal and a third feedback signal;
   a third voltage regulator adapted to provide the third supply voltage based on the third regulator control signal; and
   third feedback circuitry adapted to provide the third feedback signal based on the third supply voltage.

16. The system of claim 1 further comprising polar modulation circuitry adapted to receive a transmit signal and provide a polar signal comprising an amplitude signal and a phase signal, wherein the amplitude signal is provided to the power control circuitry as the control signal and the phase signal is provided to the power amplifier circuitry as the RE input signal.

17. The system of claim 16 wherein the amplitude signal comprises a DC component for controlling an output power of the power amplifier circuitry and an amplitude modulation component.

18. The system of claim 1 wherein the system is a mobile terminal.

19. A method of controlling a power amplifier comprising:
   a) applying a DC offset to a control signal to create an offset control signal;
   b) providing a first supply voltage to a first amplifier stage of a power amplifier based on the offset control signal such that the first supply voltage has a predetermined DC offset with respect to the control signal;
   c) providing at least one additional supply voltage to at least one additional amplifier stage of the power amplifier coupled in series with the first amplifier stage; and
   d) providing a radio frequency (RF) input signal to the first amplifier stage such that the power amplifier amplifies the RF input signal to provide an output signal, wherein the predetermined DC offset of the first supply voltage reduces variations in an AM to PM distortion of the power amplifier due to variations in an RF power of the RF input signal.

20. The method of claim 19 wherein the step of providing the first supply voltage further comprises providing the first supply voltage such that the first supply voltage has a predetermined gain with respect to the control signal.

21. The method of claim 20 further comprising selecting the predetermined gain such that the first supply voltage is a maximum value when the control signal is its maximum value.

22. The method of claim 21 wherein the step of providing the first supply voltage further comprises providing the first supply voltage such that the first supply voltage is essentially equal to the predetermined DC offset when the control signal is less than a predetermined threshold and linearly increases based on the predetermined gain when the control signal is greater than the predetermined threshold.

23. The method of claim 19 wherein the predetermined DC offset of the first supply voltage also reduces variations in the AM to PM distortion due to variations in temperature.

24. The method of claim 19 wherein the step of providing at least one additional supply voltage comprises providing a second supply voltage to a second amplifier stage coupled in series with the first amplifier stage and providing a third supply voltage to a third amplifier stage coupled in series with the second amplifier stage.

25. The method of claim 24 wherein the step or providing the second supply voltage comprises providing the second supply voltage such that the second supply voltage has a second predetermined DC offset with respect to the control signal, wherein the predetermined DC offsets of the first and second supply voltages reduce variations in the AM to PM distortion of the power amplifier circuitry due to variations in the RF power of the RF input signal.

26. The method of claim 19 wherein the step of providing the first supply voltage comprises:
  applying the DC offset to the control signal to provide the offset control signal, the DC offset selected such that the first supply voltage has the predetermined DC offset with respect to the control signal;
  providing a regulator control signal based on a comparison of the offset control signal and a feedback signal;
  providing the first supply voltage based on the regulator control signal; and
  providing the feedback signal based on the first supply voltage and a predetermined transfer function.

27. The method of claim 26 wherein the transfer function is predetermined such that the first supply voltage has a predetermined gain with respect to the control signal.

28. The method of claim 27 wherein the transfer function is further predetermined such that the first supply voltage is essentially equal to the predetermined DC offset when the control signal is less than a predetermined threshold and linearly increases based on the predetermined gain when the control signal is greater than the predetermined threshold.

29. The method of claim 26 wherein the step of providing at least one additional supply voltage comprises:
  providing a second supply voltage to a second amplifier stage of the power amplifier coupled in series with the first stage; and
  providing a third supply voltage to a third amplifier stage of the power amplifier coupled in series with the second amplifier stage.

30. The method of claim 29 wherein the step of providing the second supply voltage comprises:
  applying a second offset to the control signal to provide a second offset control signal, the second offset selected such that the second supply voltage has a second predetermined DC offset with respect to the control signal;
  providing a second regulator control signal based on a comparison of the second offset control signal and a second feedback signal;
  providing the second supply voltage based on the second regulator control signal; and
  providing the second feedback signal based on the second supply voltage and a second transfer function.

31. The method of claim 30 wherein the second transfer function is predetermined such that the second supply voltage has a predetermined gain with respect to the control signal.

32. The method of claim 31 wherein the second transfer function is further predetermined such that the second supply voltage is essentially equal to the second predetermined DC offset when the control signal is less than a predetermined threshold and linearly increases based on the predetermined gain when the control signal is greater than the predetermined threshold.

33. The method of claim 30 wherein the step of providing the third supply voltage comprises:
  providing a third regulator control signal based on a comparison of the control signal and a third feedback signal;
  providing the third supply voltage based on the third regulator control signal; and
  providing the third feedback signal based on the third supply voltage.

34. The method of claim 19 further comprising:
  providing a polar signal based on a transmit signal, the polar signal comprises an amplitude signal and a phase signal; and
  providing the amplitude signal as the control signal; and
  providing the phase signal to the first amplifier stage as the RF input signal.

35. The method of claim 34 wherein the step of providing the polar signal comprises providing the amplitude signal such that the amplitude signal comprises a DC component for controlling an output power of the power amplifier circuitry and an amplitude modulation component.

* * * * *